(12) United States Patent
Vepa et al.

(10) Patent No.: US 7,659,206 B2
(45) Date of Patent: Feb. 9, 2010

(54) REMOVAL OF SILICON OXYCARBIDE FROM SUBSTRATES

(75) Inventors: Krishna Vepa, Sunnyvale, CA (US); Yashraj Bhatnagar, Santa Clara, CA (US); Ronald Rayandayan, Union City, CA (US); Venkata Balagani, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 368 days.

(21) Appl. No.: 11/359,301

(22) Filed: Feb. 21, 2006

(65) Prior Publication Data

US 2006/0240675 A1    Oct. 26, 2006

Related U.S. Application Data

(63) Continuation-in-part of application No. 11/037,647, filed on Jan. 18, 2005, now Pat. No. 7,208,325.

(51) Int. Cl.
*H01L 21/3105*    (2006.01)
*H01L 21/311*    (2006.01)
*H01L 21/316*    (2006.01)

(52) U.S. Cl. .................. 438/694; 438/756; 438/770; 438/771; 438/773; 438/786; 438/787; 438/788; 438/705; 438/4; 257/E21.25; 257/E21.251; 257/E21.252; 257/E21.277; 257/E21.241

(58) Field of Classification Search .................. 438/694, 438/695, 723, 756, 765, 769, 770, 771, 773, 438/774, 786, 787, 788, 931, 4, 705; 257/E21.249, 257/E21.25, E21.251, E21.252, E21.277
See application file for complete search history.

(56) References Cited

U.S. PATENT DOCUMENTS

| 3,923,567 A | 12/1975 | Lawrence |
| 5,131,979 A | 7/1992 | Lawrence |
| 5,429,711 A | 7/1995 | Watanabe et al. |
| 5,700,179 A | 12/1997 | Hasegawa et al. |
| 5,800,725 A | 9/1998 | Kato et al. |
| 5,821,166 A | 10/1998 | Hajime et al. |
| 5,920,764 A | 7/1999 | Hanson |

(Continued)

FOREIGN PATENT DOCUMENTS

WO    WO 99/56310    11/1999

(Continued)

OTHER PUBLICATIONS

U.S. Appl. No. 11/237,327, filed Sep. 27, 2005, Kim et al.

(Continued)

*Primary Examiner*—M. Wilczewski
(74) *Attorney, Agent, or Firm*—Janah & Associates, P.C.

(57) ABSTRACT

A method of treating a substrate comprises depositing silicon oxycarbide on the substrate and removing the silicon oxycarbide from the substrate. The silicon oxycarbide on the substrate is decarbonized by exposure to an energized oxygen-containing gas that heats the substrate and converts the layer of silicon oxycarbide into a layer of silicon oxide. The silicon oxide is removed by exposure to a plasma of fluorine-containing process gas. Alternatively, the remaining silicon oxide can be removed by a fluorine-containing acidic bath. In yet another version, a plasma of a fluorine-containing gas and an oxygen-containing gas is energized to remove the silicon oxycarbide from the substrate.

19 Claims, 2 Drawing Sheets

U.S. PATENT DOCUMENTS

| | | | |
|---|---|---|---|
| 5,942,445 A | 8/1999 | Kato et al. | |
| 5,951,374 A | 9/1999 | Kato et al. | |
| 6,248,667 B1 | 6/2001 | Kim et al. | |
| 6,276,997 B1 | 8/2001 | Li | |
| 6,284,628 B1 | 9/2001 | Kuwahara et al. | |
| 6,358,839 B1 | 3/2002 | Li et al. | |
| 6,365,528 B1 * | 4/2002 | Sukharev et al. | 438/778 |
| 6,372,609 B1 | 4/2002 | Aga | |
| 6,387,809 B2 | 5/2002 | Toyama | |
| 6,406,923 B1 | 6/2002 | Inoue et al. | |
| 6,483,173 B2 | 11/2002 | Li et al. | |
| 6,562,700 B1 | 5/2003 | Gu et al. | |
| 6,569,777 B1 * | 5/2003 | Hsu et al. | 438/725 |
| 6,583,026 B1 * | 6/2003 | Allman et al. | 438/424 |
| 6,602,806 B1 | 8/2003 | Xia et al. | |
| 6,607,675 B1 | 8/2003 | Hsieh et al. | |
| 6,632,478 B2 * | 10/2003 | Gaillard et al. | 427/255.37 |
| 6,693,047 B1 | 2/2004 | Lu et al. | |
| 6,762,132 B1 | 7/2004 | Yates | |
| 6,881,590 B2 | 4/2005 | Wu | |
| 6,933,239 B2 | 8/2005 | Ying et al. | |
| 6,991,739 B2 | 1/2006 | Kawaguchi et al. | |
| 2001/0013507 A1 | 8/2001 | Hosali et al. | |
| 2002/0139387 A1 | 10/2002 | Yates | |
| 2003/0064607 A1 | 4/2003 | Leu et al. | |
| 2003/0166380 A1 | 9/2003 | Shibuki | |
| 2004/0084412 A1 | 5/2004 | Waldfried et al. | |
| 2004/0137748 A1 | 7/2004 | Jain et al. | |
| 2005/0042842 A1 | 2/2005 | Lei et al. | |
| 2006/0016786 A1 | 1/2006 | Tsui et al. | |
| 2006/0042651 A1 | 3/2006 | Verhaverbeke et al. | |
| 2006/0128151 A1 | 6/2006 | Ryu | |
| 2006/0292707 A1 | 12/2006 | Goodner | |
| 2007/0068900 A1 | 3/2007 | Kim et al. | |
| 2007/0190791 A1 | 8/2007 | Wang et al. | |

FOREIGN PATENT DOCUMENTS

| | | |
|---|---|---|
| WO | WO 2004010494 A3 | 1/2004 |
| WO | WO 2007/038580 | 9/2006 |

OTHER PUBLICATIONS

Enad, Christine A, USPTO Office Action dated Mar. 04, 2009 in U.S. Appl. No. 11/737,706 (US 2007/0190791).

* cited by examiner

REMOVAL OF SILICON OXYCARBIDE FROM SUBSTRATES

CROSS-REFERENCE

This application is a continuation-in-part of U.S. patent application Ser. No. 11/037,647, entitled "REFRESHING WAFERS HAVING LOW-K DIELECTRIC MATERIALS" to Wang et al, assigned to Applied Materials, Inc. and filed on Jan. 18, 2005, now U.S. Pat. No. 7,208,325 which is herein incorporated by reference in its entirety.

BACKGROUND

Embodiments of the present invention relate to removing silicon oxycarbide from substrates, particularly in the reclaiming of test substrates.

In fabricating electronic devices, various materials may be deposited onto a substrate, such as a semiconductor wafer or display, or subsequently etched from the substrate to form features such as vias, dopant regions, and interconnect lines. These materials may include metal-containing materials such as for example, aluminum, copper, tantalum, tungsten, as well as their compounds. Other materials deposited onto substrates include dielectrics such as silicon oxide or silicon nitride, and low-k (low dielectric constant) materials to separate layers of wiring and patterning from each other. These various materials may be deposited using a variety of techniques including sputtering (also referred to as physical vapor deposition or PVD), chemical vapor deposition (CVD) and thermal growth. In addition to depositing materials, other fabrication processes may be performed including doping semiconductor layers with impurities, diffusion, ion implantation, etching, chemical and mechanical polishing (CMP), cleaning, and heat treatments.

In these fabrication processes, test substrates comprising silicon wafers are often used to ensure that the processes are operating within the appropriate specifications. Rather than discard the used test substrates after they have been used to test a particular process, the used test substrates can be reclaimed. The reclamation process typically includes removing a deposited layer or material, and optionally, even removing some of the underlying silicon material so that the remaining silicon material of the test substrate is clean and substantially free of added materials or other contaminants. As a consequence, the reclamation process is intended to restore the test substrate to the same specifications as a new test substrate.

Conventional methods for reclaiming a test substrate include techniques such as, for example, chemical etching, grinding, or polishing. Wet chemical etching generally involves dipping the substrate into acidic or basic baths to remove the unwanted material from a substrate. Dry chemical etching, also known as plasma etching, involves the removal of unwanted material from a substrate through exposure to plasma gases in a vacuum chamber. Grinding and polishing involve the removal of layers of deposited material using grinding media and polishing slurries to flatten and thin out the substrate.

In the reclaiming of test substrates, it is particularly difficult to remove deposited silicon oxycarbide because it has both inorganic and carbon components, comprising, for example, amorphous silicon oxide with high carbon content, and which may comprise other materials, such as nitrogen and hydrogen. Silicon oxycarbide can be used as a low dielectric constant material (silicon oxycarbide) when it has a composition that provides a low dielectric constant (k) of less than about 3.5. Low-k dielectrics reduce the RC delay time in integrated circuits allowing corresponding increases in metal interconnect density, and thus, ever smaller circuitry. Accordingly, the deposition of low-k dielectrics such as silicon oxycarbide is important for the fabrication of ever smaller and finer circuits having feature sizes of less than 90 nm. In these deposition processes, test substrates are used to ensure the deposition of silicon oxycarbide having specified low-k properties on the substrate.

It is desirable to reclaim and reuse the test substrates that are used in testing silicon oxycarbide processes. However, conventional silicon oxycarbide removal processes often fail to suitably remove the material from the test substrates. For instance, silicon oxycarbide materials are often difficult to remove chemically, as the combination of organic and inorganic elements renders the material less reactive to chemical compositions, and such compositions can leave a gummy residue on the substrate. Also, conventional means such as grinding and polishing can cause the substrate to warp from the uneven pressures applied to the substrate. Polishing can also cause excessive scratches on the substrate surface or subsurface lattice damage. Such surface damage undesirably affects subsequent deposition process characteristics of the substrate surface, thereby altering deposition process results. As such, conventionally reclaimed substrates are often only suitable as mechanical-grade testing wafers, for example, for robot testing to evaluate accurate wafer positioning, but may not be suitable as test-grade substrates for evaluating deposition or etching processes. Conventional removal methods can also erode away an excessive amount of the substrate surface, limiting the number of times a test substrate can be reclaimed and re-used, before the substrate has to be disposed. Accordingly, conventional silicon oxycarbide removal techniques often do not provide satisfactory removal of these materials to allow re-use of the test substrates.

It is therefore desirable to remove silicon oxycarbide from a substrate with a process that can remove both the inorganic and carbon components of the silicon oxycarbide material. It is also desirable to have a removable method which does not cause warpage, surface scratches, or sub-surface damage of the substrate. It is further desirable to be able to cost effectively remove the silicon-oxycarbide in a production worthy process.

SUMMARY

In a method of treating a substrate comprising silicon oxycarbide, the silicon oxycarbide is removed from the substrate. The silicon oxycarbide is decarbonized by exposing the substrate to an oxygen-containing gas while heating the substrate to a temperature less than or equal to about 400° C. to convert the silicon oxycarbide to silicon oxide. The silicon oxide is removed by exposing the silicon oxide to a fluorine-containing acidic solution; or alternatively, the substrate is exposed to a plasma process gas comprising fluorine-containing gas to remove substantially the entire thickness of the silicon oxide. In an initial process step, the silicon oxycarbide can also be deposited on the substrate.

A substrate processing apparatus capable of performing these processes comprises a reactor comprising an enclosure with a support to receive a substrate with a silicon oxycarbide layer, a gas inlet for introducing an oxygen-containing gas into the chamber, and a heater to heat the substrate in the chamber to remove the silicon oxide on the substrate. Further, the substrate processing apparatus also includes a bath for receiving the substrate with the silicon oxide, the bath comprising a fluorine-containing acidic solution to remove the silicon oxide on the substrate.

In yet another method, a substrate comprising silicon oxycarbide is placed in a plasma zone and a process gas comprising fluorine-containing gas and oxygen-containing gas is introduced into the plasma zone. The process gas is maintained at about a pressure of from 200 mTorr to about 2000 mTorr. The process gas is energized by coupling RF energy to the process gas at a power level of from about 200 watts to about 2000 watts. A substrate processing apparatus capable of performing this process comprises a plasma chamber comprising an enclosure with a support to receive at least one substrate, a gas inlet to introduce a process gas into the chamber, a gas energizer to sustain a plasma of the process gas in the chamber, and an exhaust port to remove the process gas from the chamber.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of particular drawings, and the invention includes any combination of these features, where:

DESCRIPTION

Figure 1A:
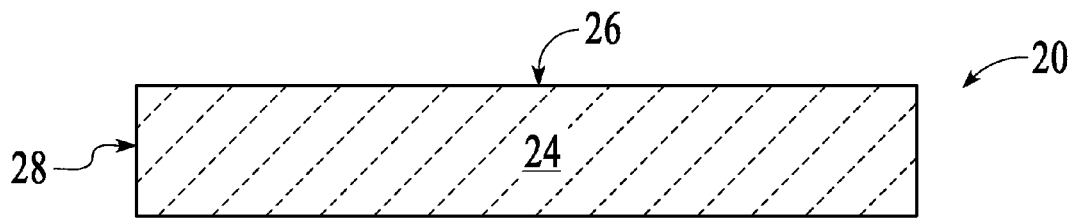
FIG. 1A is a schematic sectional diagram of a substrate on which silicon oxycarbide is deposited.
Figure 1B:
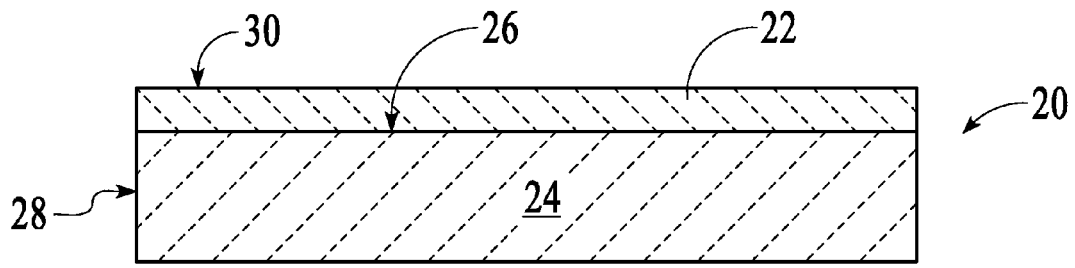
FIG. 1B is a schematic sectional diagram showing the treated substrate of FIG. 1A after removal of the silicon oxycarbide.

A process for efficiently treating a substrate 20 to remove silicon oxycarbide 22 from the substrate 20 allows the substrate, for example, to be reused as a test wafer in deposition and other processes. While the silicon oxycarbide removal process is illustrated in the context of removal of a silicon oxycarbide layer from a test substrate on which the material is initially deposited, it should be understood that the removal process can be used to remove all of, or etch a portion of, the silicon oxycarbide material or layer from a substrate, including production substrates on which integrated circuits and displays are being fabricated. The silicon oxycarbide 22 typically comprises silicon oxide having from about 5 to about 40 wt % carbon, and can also contain other materials such as nitrogen or hydrogen. The silicon oxycarbide 22 may be formed by a deposition process such as a chemical vapor deposition process or a liquid precursor spin-on process, as for example, processes used to form "BLACK DIAMOND™" or "SILK™", by Applied Materials, Inc., Santa Clara, Calif. The silicon oxycarbide 22 comprises a dielectric constant of less than about 3.5, such as from about 2 to about 3.4. The silicon oxycarbide 22 may be formed on an underlying surface 26 of a wafer 24, which may be, for example, a silicon or compound semiconductor wafer, and may even substantially cover the underlying surface 26 of the wafer 24, as shown in FIG. 1A. The silicon oxycarbide 22 may comprise a substantially planar film (as shown) or may alternatively comprise a layer having a plurality of etched features therein. The silicon oxycarbide 22 may also be formed over one or more side surfaces 28 of the wafer 24. The removal process desirably removes the silicon oxycarbide 22 from the substrate 20 substantially without excessively eroding or otherwise damaging the underlying wafer 24 to allow the wafer to be re-used for subsequent testing and/or processing.

In one version, a method of removing the silicon oxycarbide 22 comprises heating the substrate 20 to a temperature less than or equal to about 400° C. while exposing its surface 30 to an oxygen-containing gas. Exposing the surface 30 to an oxygen-containing gas while heating, decarbonizes the silicon oxycarbide 22 to form silicon oxide having a lower carbon content or substantially no carbon content. Typically, the silicon oxycarbide 22 has pores that allow the oxygen-containing gas to penetrate into the material to react with carbon present in the interior regions to form volatile gases such as carbon dioxide and carbon monoxide. For example, an amorphous silicon oxycarbide can have a porosity of from about 2 to about 40 vol %. A suitable oxygen-containing gas comprises oxygen species, for example, $O_2$, $O_3$, $H_2O$, $H_2O_2$ and mixtures thereof. Process conditions suitable for decarbonizing silicon oxycarbide 22 containing from about 5 to about 40 wt % carbon, comprises exposing the substrate 22 to oxygen while heating the substrate to a temperature of from about 250 to about 300° C. for a time of from about 40 to about 80 minutes.

Figure 2:
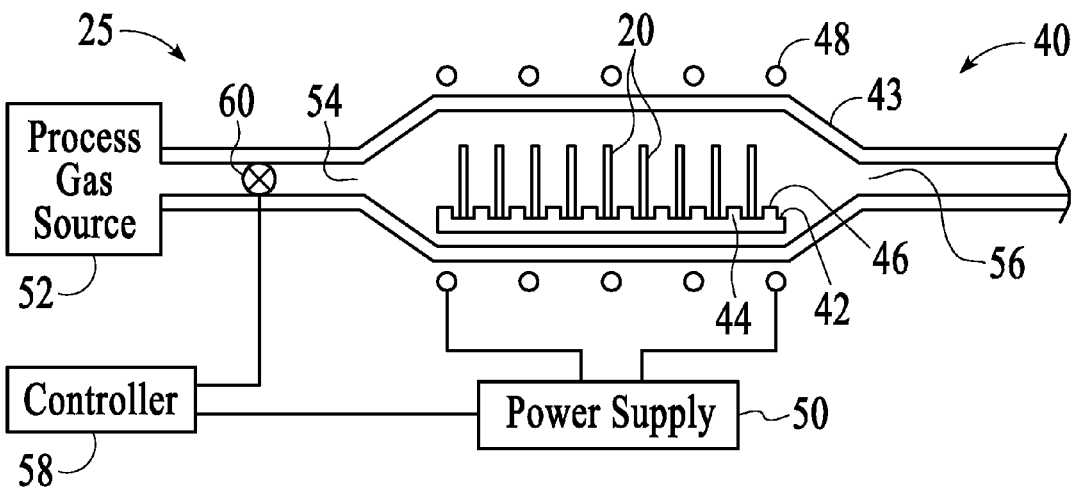
FIG. 2 is a schematic sectional diagram of a substrate processing apparatus comprising a reactor capable of decarbonizing the silicon oxycarbide on a batch of substrates.

In one version of the decarbonization process, the surface 30 of the silicon oxycarbide 22 is exposed to oxygen-containing gas while heating the substrate 20 in a substrate processing apparatus 25 comprising a reactor 40, as shown in FIG. 2. In this version, the reactor 40 comprises a support 42 to receive one, or a batch of substrates 20 (as shown), in an enclosure 43. The support 42 can comprise base 44 with parallel ridges 46 which are spaced apart to support substrates 20 in the groves defined therebetween. In the version shown, the reactor 40 has a coil 48 wrapped around the reactor body which is powered by a power supply 50. A process gas source 52, which can be an oxygen-containing gas source, provides a process gas comprising for example oxygen-containing gas, to a gas inlet 54 of the reactor 40. The spent oxygen-containing gas and gaseous byproducts, such as carbon monoxide and carbon dioxide, are exhausted from the reactor via the exhaust port 56, which can be connected to an exhaust pump or vent to the atmosphere. A controller 58 controls operation of the reactor 40 by controlling a gas valve 60 and the power supply 50. The controller 50 comprises program code to set the power level of the power supply 50 for the desired heating time, and to control operation of valve 60 to set the flow rate of the process gas into the reactor 40.

In one version, silicon oxycarbide 22 is decarbonized by heating the substrate 20 in the reactor 40 using a coil 48 which is a heater and comprises a resistive heater element. For example, the coil 48 can be made from an electrically resistive material such as, for example, NICHROME™—a nickel-chromium alloy with high electrical resistance and an ability to withstand high temperatures used for resistance heating elements; molybdenum disilicide; or other materials. In this version, the power supply 50 is a conventional resistance heater power supply, which can include a closed loop control system comprising a PID automatic temperature controller to pass a current through the resistive heater element, a thermocouple to measure the temperature in the reactor 40, and a digital temperature read-out. The heater power supply can also have adjustable minimum and maximum current limits and programmable ramp rates and dwell times. The enclosure 43 of the reactor 40 can be made, for example, from silicon oxide, quartz or aluminum oxide. During heating, the reactor 40 can be continuously purged with the oxygen-containing gas to maintain the high oxygen content. A suitable flow of an oxygen-containing gas into the reactor 40, such as $O_2$, may be for example, from about 2000 sccm to about 5,000 sccm. While the heater in the version shown is a coil 48, other heaters, such as planar or tube heaters can also be used.

In another process variant, the silicon oxycarbide 22 is decarbonized by exposing its surface 30 to a plasma formed inside the reactor 40. In this version, the reactor 40 is a plasma chamber to form a plasma comprising an energized process gas, for example, an energized process gas comprising oxygen-containing species. In this version, the oxygen-containing gas in the reactor 40 is excited to a plasma state to form oxygen atoms having high oxidation capability to oxidize silicon oxycarbide 22 on the substrate 20. The process gas can also include diluent gases such as nitrogen or argon. The process gas can be energized by applying RF or microwave energy to the gas. For example, in one version, a batch of substrates 20 is placed in the reactor 40 and exposed to plasma formed by applying a current to the coil 43, which in this version, is a gas energizer comprising an induction coil that generates heat by forming a plasma from the oxygen-containing gas in the reactor 40. The induction coil is powered to inductively couple energy to the oxygen-containing gas in the reactor 40. The power supply 50 is an induction coil power supply, which applies a suitable power level to energize the gas, such as a power level of from about 200 watts to about 2000 watts. The oxygen-containing gas is flowed into the plasma chamber as a flow rate of from about 250 sccm to about 500 sccm, and the gas is maintained at a pressure of from about 200 to about 2000 mTorr. Instead of an induction coil, the oxygen-containing gas can also be energized by electrodes (not shown) about the walls of the reactor 40 or a microwave applicator (not shown) outside the reactor 40.

Figure 3:
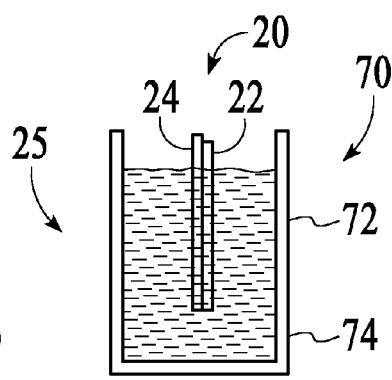
FIG. 3 is a schematic sectional diagram of a wet chemical bath of the substrate processing apparatus.

After the silicon oxycarbide 22 has been exposed to the oxygen-containing gas and heated to convert substantially all the silicon oxycarbide 22 to silicon oxide 22 which contains a lower level of carbon than before or substantially no carbon, a wet chemical etching step can be used to remove this silicon oxide, as well as residual un-oxidized portions of the original silicon oxycarbide. In the wet chemical etching process, the substrate 20 is dipped into a bath 70 of the substrate processing apparatus 25, as shown in FIG. 3. The bath 70 comprises a chemical etchant solution 72 in a container 74 made from a material which is resistant to the chemical etchant solution. The composition of the chemical etchant solution 72 is selected to etch away the silicon oxide 22 substantially without eroding the underlying silicon of the substrate 20. In one version; the chemical etchant solution comprises, for example, a fluorine-containing acidic solution which is capable of removing the silicon oxide 22. A suitable container 74 resistant to a fluorine-containing acidic solution comprises a polymeric container. In one example, the fluorine-containing acidic solution comprises HF in a concentration of from about 1% to about 12 vol %.

The chemical etching solution can also comprise a carbon-removal component capable of reacting with any residual carbon-containing species, or residual silicon oxycarbide, present in the silicon oxide 22. The fluorine-containing acidic solution and carbon-removal component operate together to break bonds among both the silicon-oxygen species and carbon species in the silicon oxycarbide 22, to thereby remove the silicon oxide and residual carbon from the substrate 20. In one version, a suitable carbon-removal component comprises $H_2SO_4$. For example, the solution can comprise a mixture of from about 1% to about 10% by weight of HF, and from about 30% to about 40% by weight of $H_2SO_4$. A desired molar ratio of HF to $H_2SO_4$ in the solution may be from about 1:10 to 1:20. While in one version the chemical etchant solution can consist essentially of HF and $H_2SO_4$, in other versions the solution can comprise other components, such as for example at least one of $HNO_3$, $H_2O_2$ and $NH_4F$. A suitable immersion time may be from about 10 minutes to about 60 minutes. The chemical etchant solution can remove a bulk portion of the silicon oxycarbide 22, including any remaining oxidized as well as unoxidized portions of the layer 22, and comprises a composition that does not excessively erode the underlying substrate 20.

Instead of a wet chemical etching process to remove the silicon oxide formed by decarbonizing the silicon oxycarbide 22, a dry plasma process can also be used to remove the silicon oxide and residual carbon, if any, by exposing the surface 30 of the silicon oxide to a plasma formed inside the reactor 40 of FIG. 2, which in this version is a plasma chamber. In this version, the plasma comprises an energized gas comprising energized fluorine-containing species. A process gas comprising a fluorine-containing gas is introduced into the reactor 40 and excited to a plasma state to form fluorine species that react with silicon oxide to form volatile silicon fluoride which is exhausted from the reactor 40. The fluorine-containing gas can be, for example, $CF_4$, $NF_3$ or $SF_6$. The fluorine-containing gas can further comprise an oxygen-containing gas, such as the aforementioned gases. The fluorine-containing gas can also be energized by applying RF or microwave energy to the gas. For example, in one version, a plurality of substrates 20 placed in the reactor 40 are exposed to fluorine-containing plasma formed by applying a current to the coil 43, which in this version serves as a gas energizer and is an induction coil, to form a plasma from the gas in the reactor 40 by inductively coupling energy to the gas. The power supply 50 applies a suitable power level to energize the gas, such as a power level of from about 200 watts to about 2000 watts. The fluorine-containing gas is flowed into the chamber as a flow rate of from about 100 sccm to about 700 sccm, and the gas is maintained at a pressure of from about 200 to about 2000 mTorr.

In yet another process, the silicon oxycarbide 22 on the substrate 20 is both decarbonized and its silicon oxide content removed in a single plasma process step. In this process, the surface 30 of the silicon oxycarbide 22 is exposed to a plasma of a process gas comprising both fluorine-containing gas and oxygen-containing gas in the reactor 40 of FIG. 2. In this version, the fluorine-containing gas forms fluorine species that react with silicon oxide to form volatile silicon-fluorine species, and the oxygen-containing gas reacts with carbon in the silicon oxycarbide 22 to form carbon-oxygen species such as carbon monoxide and carbon dioxide, which are then exhausted from the reactor 40. The oxygen-containing gases can be, for example, $O_2$, $O_3$, $H_2O$, $H_2O_2$ and mixtures thereof; and the fluorine-containing gas can be, for example, $CF_4$, $NF_3$ or $SF_6$. The process gas is energized by applying RF or microwave energy to the gas. As shown, a plurality of substrates 20 can be placed in the reactor 40 and exposed to plasma formed by applying a current to an induction coil 43 to inductively coupling energy to the process gas. The power supply 50 applies a suitable power level to energize the process gas, such as a power level of from about 200 watts to about 2000 watts. The process gas is flowed into the chamber as a flow rate of from about 300 sccm to about 1200 sccm, and the gas is maintained at a pressure of from about 200 to about 2000 mTorr, to both remove substantially an entire layer of silicon oxycarbide 22 on the substrate 20.

Figure 4:
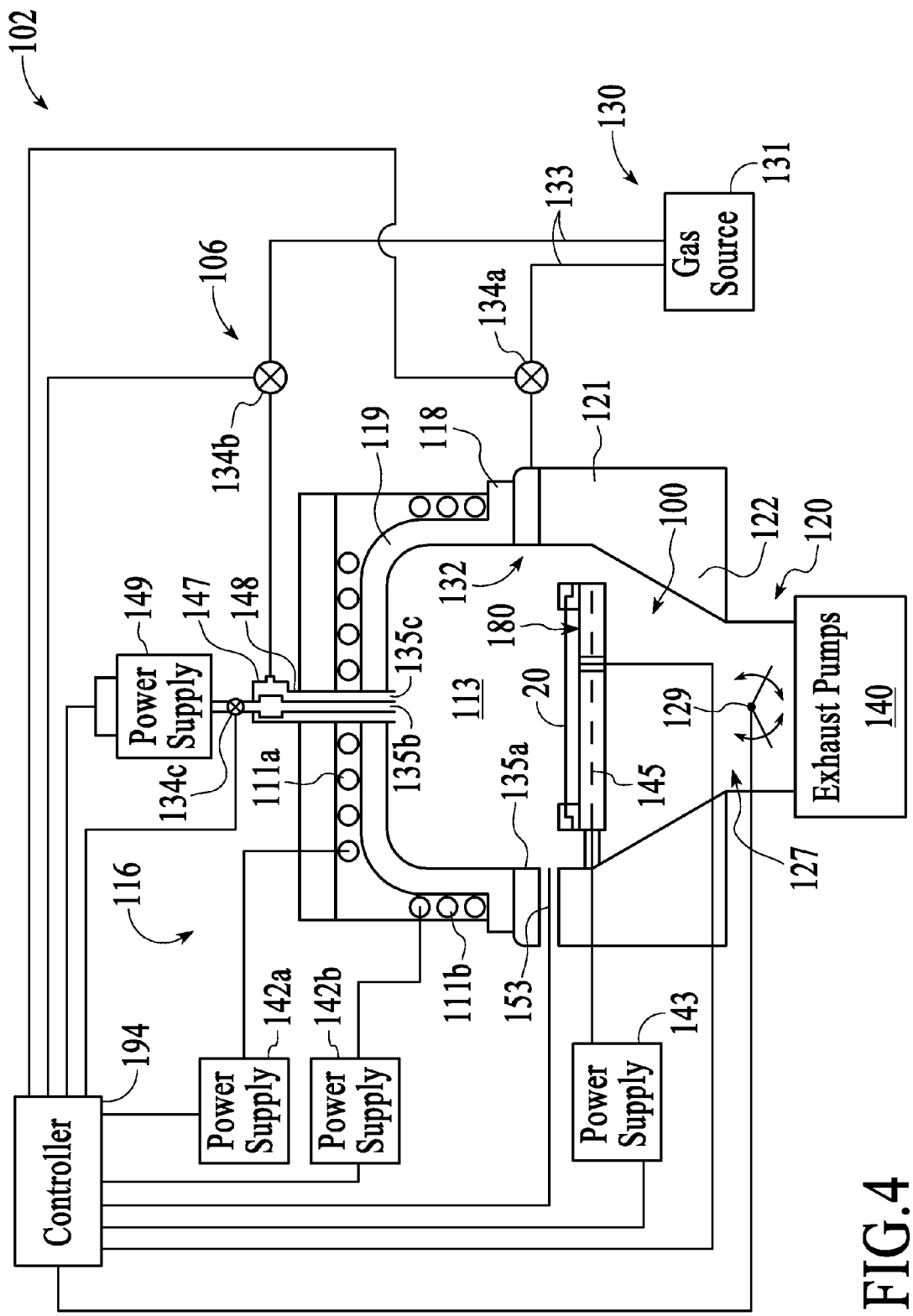
FIG. 4 is a schematic sectional diagram of another embodiment of a plasma chamber of a substrate processing apparatus.

In the above described processes, silicon oxycarbide 22 is removed from the substrate 20. The silicon oxycarbide 22 can be formed on the substrate 20 using a substrate processing apparatus 102 comprising a chemical vapor deposition chamber 106, an embodiment of which is shown in FIG. 4. The chamber 106 may be capable of forming silicon oxycarbide 22 on a fresh substrate 20 or one that has been reclaimed after removing previously deposited silicon oxycarbide 22. The chamber 106 comprises enclosure walls 118, which include a ceiling 119, sidewalls 121, and a bottom wall 122, that together define a process zone 113. For example, in one version, the enclosure walls 118 comprise a partially domed ceiling 119 over the process zone 113. A deposition gas can be introduced into the chamber 106 through a gas supply 130 that includes a deposition gas source 131 and a gas distributor 132. In the version shown, the gas distributor 132 comprises one or more conduits 133 having one or more gas flow valves 134a,b and one or more gas outlets 135a around a periphery of the substrate 20, as well as one or more outlets 135b,c above the substrate 20 to provide an optimized flow of deposition gas in the chamber 106. An electrode 145 in an electrostatic chuck 108 of a substrate support 100 may be powered by an electrode power supply 143 to electrostatically hold a wafer on the support surface 180 during processing. A wafer transport 153 can also be provided to position the substrate 20 on a wafer receiving surface 180 of the support 100. Spent process gas and process byproducts are exhausted from the chamber 106 through an exhaust 120 which may include an exhaust conduit 127 that receives spent process gas from the process zone 113, a throttle valve 129 to control the pressure of process gas in the chamber 106, and one or more exhaust pumps 140.

In one version, the deposition gas may be energized to process the substrate 20 by a gas energizer 116 comprising an antenna 117 having one or more inductor coils 111a,b which may have a circular symmetry about the center of the chamber to couple energy to the process gas in the process zone 113 of the chamber 106. For example, the antenna 117 may comprise a first inductor coil 111a about a top portion of the domed ceiling 119 of the chamber 106, and a second inductor coil 111b about a side portion of the domed ceiling 119. The inductor coils may be separately powered by first and second RF power supplies 142a,b. The gas energizer 116 may also comprise one or more process electrodes that may be powered to energize the process gas. A remote chamber 147 may also be provided to energize a process gas, such as a cleaning gas, which is energized by a power supply 149 that couples RF or microwave energy to the remote chamber 147, and the energized gas can be delivered via a conduit 148 having a flow valve 134c to the chamber 106, for example to clean the chamber.

To process a substrate 20, for example by forming silicon oxycarbide dielectric layer 22 on the substrate 20, the process chamber 106 is evacuated and maintained at a predetermined sub-atmospheric pressure. The substrate 20 is then provided on the support 100 by the wafer transport 153, and it may be held on the support 100 by applying a voltage to an electrode 145 in the support 100 via an electrode power supply 143. The gas supply 130 provides a process gas to the chamber 106 and the gas energizer 116 couples RF or microwave energy to the process gas to energize the gas to process the substrate 20. Effluent generated during the process is exhausted from the chamber 106 by the exhaust 120.

The chamber 106 can be controlled by a controller 194 that comprises program code having instruction sets to operate components of the chamber 106 to process substrates 20 in the chamber 106. For example, the controller 194 can comprise a substrate positioning instruction set to operate one or more of the substrate support 100 and wafer transport 153 to position a substrate in the chamber 106; a gas flow control instruction set to operate the gas supply 130 and flow control valves to set a flow of gas to the chamber 106; a gas pressure control instruction set to operate the exhaust 120 and throttle valve to maintain a pressure in the chamber 106; a gas energizer control instruction set to operate the gas energizer 116 to set a gas energizing power level; a temperature control instruction set to control temperatures in the chamber 106; and a process monitoring instruction set to monitor the process in the chamber 106.

In operation, the silicon oxycarbide material is deposited by flowing an organosilane precursor gas and oxygen or ozone into the chamber 106 and heating the substrate 20 to a temperature of, for example, about 300 to about 400° C. The deposition process is a thermal CVD process used to form silicon oxycarbide having a sufficiently low dielectric constant. The organosilane precursor gas should have at least one silicon-carbon bond, such as for example, methylsilane, dimethylsilane (DMS), trimethylsilane (TMS), tetramethylsilane (T4MS) and phenylmethylsilane. Because of their commercial availability and high number of silicon-carbon bonds, TMS and T4MS are preferred precursor gases. In one exemplary process, a process gas of TMS, oxygen and helium is used. In one example of such a process, initially, helium at a flow rate of 2650 sccm is introduced into the chamber 106, and when the gas flow has stabilized to a pressure of 3.5 Torr, the throttle valve 129 is partially closed and the pressure within the chamber 106 is brought to the desired deposition pressure level. Once the desired pressure level is reached and maintained for a couple of seconds, a process gas is flowed into the chamber 106, the process gas comprising TMS at a flow rate of 1450 sccm, oxygen at a flow rate of 800 sccm, and helium carrier gas at a flow rate of 400 sccm. The process gas is energized with RF power applied at a power level of 950 Watts to electrodes at a spacing of about 200 mils, to deposit silicon oxycarbide 22 on the substrate 20. The walls 118 of the chamber 106 can be maintained at a temperature of about 50° to 60° C. Silicon oxycarbide deposited according to such a process generally has a density of from about 2.1 to about 2.2 g/cm$^3$. The process can also include additional plasma purge steps with a helium carrier gas flow rate of 1000 sccm and a helium purge step at a flow rate of 1850 sccm. After the silicon oxycarbide is deposited, it can be cured to increase its resistance to moisture absorption in a conventional furnace or vacuum chamber by heating the silicon oxycarbide to a temperature of from about 300 to about 500° C. for at least about 10 minutes.

The present invention has been described with reference to certain preferred versions thereof; however, other versions are possible. For example, other types of silicon oxycarbide can be removed, or partially removed, for example in the etching of features in the silicon oxycarbide, as would be apparent to one of ordinary skill. Further, alternative steps equivalent to those described for the removal process can also be used in accordance with the parameters of the described implementation, as would be apparent to one of ordinary skill. Therefore, the spirit and scope of the appended claims should not be limited to the description of the preferred versions contained herein.

What is claimed is:

1. A method of treating a substrate comprising silicon oxycarbide, the method comprising:
   (a) decarbonizing the silicon oxycarbide by exposing the substrate to an oxygen-containing gas while heating the substrate to a temperature of from about 250° C. to about 300° C., and for a time about 40 to about 80 minutes, whereby the silicon oxycarbide is converted to silicon oxide; and
   (b) removing the silicon oxide on the substrate by exposing the silicon oxide to a fluorine-containing acidic solution comprising HF and $H_2SO_4$, in a molar ratio of HF to $H_2SO_4$ of from about 1:10 about 1:20.

2. A method according to claim 1 wherein (a) comprises exposing the substrate to an oxygen-containing gas comprising $O_2$ or $O_3$.

3. A method according to claim 1 wherein (a) comprises exposing the substrate to an oxygen-containing gas comprising $H_2O$.

4. A method according to claim 1 wherein (a) comprises exposing the substrate to an oxygen-containing gas comprising $H_2O_2$.

5. A method according to claim 1 wherein (a) comprises setting process conditions to decarbonize the silicon oxycarbide by removing from about 5 to about 40 wt % carbon from the silicon oxycarbide.

6. A method according to claim 1 wherein (a) comprises heating the substrate by energizing the oxygen-containing gas by coupling RF energy to the gas to form a plasma of oxygen-containing gas.

7. A method according to claim 1 wherein (a) comprises heating the substrate by passing a current through a resistive heater.

8. A method according to claim 1 wherein (b) comprises exposing the substrate to a fluorine-containing acidic solution comprising HF having a concentration of from about 1 to about 12 vol %.

9. A method according to claim 1 comprising the initial step of depositing the silicon oxycarbide on the substrate.

10. A method according to claim 1 wherein the process of (a) includes exposing the substrate to a diluent gas.

11. A method according to claim 10 wherein the diluent gas comprises nitrogen or argon.

12. A method of treating a substrate comprising silicon oxycarbide, the method comprising:
   (a) decarbonizing the silicon oxycarbide by exposing the substrate to an energized oxygen-containing gas while heating the substrate to a temperature of from about 250° C. to about 300° C., and for a time of from about 40 to about 80 minutes, whereby the silicon oxycarbide is converted to silicon oxide; and
   (b) removing substantially the entire thickness of the silicon oxide by exposing the substrate to a plasma of a process gas comprising a fluorine-containing gas.

13. A method according to claim 12 wherein in (b) the fluorine-containing gas comprises $CF_4$, $NF_3$ or $SF_6$.

14. A method according to claim 12 wherein in (b) the process gas further comprises an oxygen-containing gas.

15. A method according to claim 14 wherein the oxygen-containing gas comprises $O_2$ or $O_3$.

16. A method according to claim 14 wherein the oxygen-containing gas comprises $H_2O$ or $H_2O_2$.

17. A method according to claim 12 wherein (b) comprises maintaining the process gas at a pressure of from about 200 to about 2000 mTorr.

18. A method according to claim 12 wherein (b) comprises sustaining a plasma by coupling energy to the process gas at a power level of from about 200 to about 2000 Watts.

19. A method according to claim 12 comprising the initial step of depositing the silicon oxycarbide on the substrate.

* * * * *